United States Patent [19]

Wichmann

[11] Patent Number: 5,055,903

[45] Date of Patent: Oct. 8, 1991

[54] CIRCUIT FOR REDUCING THE LATCH-UP SENSITIVITY OF A CMOS CIRCUIT

[75] Inventor: Bernhard Wichmann, Pöring, Fed. Rep. of Germany

[73] Assignee: Siemens Aktiengesellschaft, Munich, Fed. Rep. of Germany

[21] Appl. No.: 538,822

[22] Filed: Jun. 15, 1990

[30] Foreign Application Priority Data

Jun. 22, 1989 [DE] Fed. Rep. of Germany ....... 3920531

[51] Int. Cl.$^5$ .............................................. H01L 27/02
[52] U.S. Cl. ...................................... 357/42; 307/313
[58] Field of Search ................. 357/42, 23.13; 307/313

[56] References Cited

U.S. PATENT DOCUMENTS

| 3,636,372 | 1/1972 | Hujita et al. | 307/251 |
| 4,021,687 | 5/1977 | Yoshimura | 307/300 |
| 4,647,956 | 3/1987 | Shrivastava et al. | |
| 4,881,105 | 11/1989 | Davari et al. | 357/23.4 |
| 4,922,317 | 5/1990 | Mihara | 357/42 |

FOREIGN PATENT DOCUMENTS

| 0276850 | 8/1988 | European Pat. Off. | |
| 3806951 | 9/1988 | Fed. Rep. of Germany | |
| 3743930 | 7/1989 | Fed. Rep. of Germany | |
| 60-123053 | 6/1985 | Japan | 357/42 |

OTHER PUBLICATIONS

IEEE Transactions on Electron Devices, vol. ED-31, No. 1, Jan. 1984, pp. 62-67; Genda J. Hu: "A Better Understanding of CMOS Latch-Up".
IEEE Circuits and Devices Magazine, H.3, 1988, pp. 8-12; John Y. Chen et al: "Parasitic Effects in CMOS VLSI".
Atlas of IC Technologies: W. Maly: "An Introduction to VLSI Processes", pp. 244-249; The Benjamin/Cummings Publishing Company, Inc.
Dingwall and Stricker: Bulk CMOS Technology; IEEE Journal of Solid State Circuits, vol. SC-12, No. 4, Aug. 4, 1977, pp. 345-348.
R. Troutman: "Latch-Up in CMOS Technology", 1986, pp. 165-196.
R. S. Muller et al: "Device Electronics for Integrated Circuits"; 1986, pp. 458,465.

Primary Examiner—Jerome Jackson, Jr.
Assistant Examiner—D. Monin
Attorney, Agent, or Firm—Herbert L. Lerner; Laurence A. Greenberg

[57] ABSTRACT

A circuit for reducing the latch-up sensitivity in complementary MOS technology includes a semiconductor substrate of a second conduction type. A first MOS transistor of a first complementary conduction type is disposed in the semiconductor substrate and has a source structure. A well of the first conduction type is disposed in the semiconductor substrate. A second MOS transistor of the second conduction type is disposed in the well and has a source structure. The semiconductor substrate and the source structure of the first transistor are connected to a first supply potential. The well and the source structure of the second transistor are connected to a second supply potential. A third transistor of the first conduction type is disposed in the semiconductor substrate between the first and second transistors. The third transistor has a gate connected to the first supply potential, a drain structure connected to the second supply potential, and a source structure connected to an output.

8 Claims, 1 Drawing Sheet

CIRCUIT FOR REDUCING THE LATCH-UP SENSITIVITY OF A CMOS CIRCUIT

BACKGROUND OF THE INVENTION

1. Field of the Invention

The invention relates to a circuit for reducing the latch-up sensitivity in complementary MOS technology, including a first MOS transistor of a first conduction type being disposed in a semiconductor substrate having a complementary second conduction type; a second MOS transistor of the second conduction type being disposed in a well of the first conduction type in the semiconductor substrate; the semiconductor substrate and the source structure of the first transistor being connected to a first supply potential; and the well and the source structure of the second; transistor being connected to a second supply potential.

2. Description of the Related Art

The danger of a latch-up effect is known and described in the literature (R. Troutman, Latch-up in CMOS Technology, Kluwer Academic Publishers 1986; and R. Muller, Device Electronics for Integrated Circuits, Wiley 1986) regarding CMOS technology. The term latch-up effect refers to the firing of a parasitic thyristor, which is formed by adjacent complementary transistors of the CMOS circuit and the resultant pnpn structure. The parasitic thyristor is composed of two bipolar transistors and is blocked under normal operating conditions. Such a device is more fully discussed below in the description of the drawings.

It is known to place an additional doped zone, known as a guard ring, between the two complementary transistors and to connect it to a predetermined potential, in order to siphon off the charge carriers and suppress a latch-up effect caused by minority carriers. This is particularly advantageous if a weakly doped semiconductor layer is applied, for instance by epitaxia, onto a highly doped semiconductor substrate, and the MOS transistors are disposed in such a high-impedance semiconductor layer. Minority carriers will then remain in that weakly doped layer, because they are exposed to less resistance at that location than in the highly doped substrate. A circuit of that kind is known from the aforementioned publication by R. Troutman on page 167 and is discussed in more detail below in the description of the drawings.

It is accordingly an object of the invention to provide a circuit for reducing the latch-up sensitivity of a CMOS circuit, which overcomes the hereinafore-mentioned disadvantages of the heretofore-known devices of this general type and in which minority carriers injected into the substrate are removed with high effectiveness and the latch-up sensitivity is reduced, even in the event of major disturbances at the output level.

SUMMARY OF THE INVENTION

With the foregoing and other objects in view there is provided, in accordance with the invention, a circuit for reducing the latch-up sensitivity in complementary MOS technology, comprising a semiconductor substrate of a second conduction type; a first MOS transistor of a first complementary conduction type being disposed in the semiconductor substrate and having a source structure; a well of the first conduction type being disposed in the semiconductor substrate; a second MOS transistor of the second conduction type being disposed in the well and having a source structure; the semiconductor substrate and the source structure of the first transistor being connected to a first supply potential; the well and the source structure of the second transistor being connected to a second supply potential; a third transistor of the first conduction type being disposed in the semiconductor substrate between the first and second transistors; and the third transistor having a gate connected to the first supply potential, a drain structure connected to the second supply potential, and a source structure connected to an output.

In accordance with another feature of the invention, the first transistor has a drain structure disposed closely adjacent the source structure of the third transistor.

In accordance with a further feature of the invention, the first transistor has a drain structure being overlapped by the source structure of the third transistor.

In accordance with an added feature of the invention, the first conduction type is p-conductivity and the second conduction type is n-conductivity; the semiconductor substrate is n-doped; the well is p-doped; and the first supply potential is greater than the second supply potential.

In accordance with an additional feature of the invention, the first conduction type is n-conductivity and the second conduction type is p-conductivity; the semiconductor substrate is p-doped; the well is n-doped; and the first supply potential is less than the second supply potential.

In accordance with a concomitant feature of the invention, the semiconductor substrate is relatively highly doped; and there is provided a relatively weakly doped semiconductor layer having the same conduction type as the semiconductor substrate and being disposed on the semiconductor substrate; the well and the transistors being disposed in the semiconductor layer.

Other features which are considered as characteristic for the invention are set forth in the appended claims Although the invention is illustrated and described herein as embodied in a circuit for reducing the latch-up sensitivity of a CMOS circuit, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENT

Figure 1:
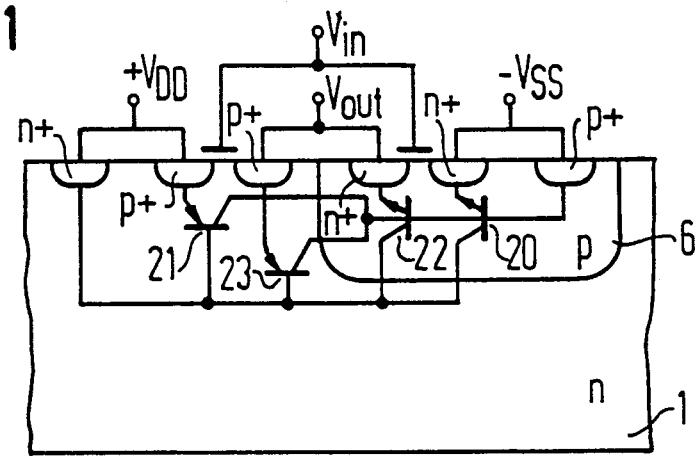
FIG. 1 is a fragmentary, diagrammatic and schematic, cross-sectional view of a CMOS circuit showing parasitic bipolar transistors.

Referring now in detail to the figures of the drawing in which the same elements are provided with the same reference numerals and first, particularly, to FIG. 1 thereof, there is seen a circuit of the type discussed in the publications by R. Troutman and R. Muller, as mentioned above. As is diagrammatically and schematically shown in FIG. 1, with p-well technology, for example, one vertical npn transistor 20 is located in a well 6 and a horizontal pnp transistor 21 is located in a semiconductor substrate 1. The collector of one transistor is simultaneously the base of the other. Correspondingly, a thyristor can be formed with one of two parasitic bipolar transistors 22, 23, the emitters of which are connected to an output $V_{OUT}$. The firing of the thyristor can lead to a functional failure and to destruction of the circuit and can be tripped by disturbances, or in other words voltage peaks, at one of several leads $V_1$, $V_2$, $V_{IN}$, $V_{OUT}$, resulting in the injection of minority or majority carriers into the semiconductor substrate 1 and the well 6, depending on the algebraic sign (+ or −) of the disturbance.

In order to suppress a latch-up effect caused by minority carriers, it is known to place an additional doped zone, known as a guard ring, between the two complementary transistors and to connect it to a predetermined potential, in order to siphon off the charge carriers. Such a structure is particularly advantageous if a weakly doped semiconductor layer is applied, for instance by epitaxia, onto a highly doped semiconductor substrate, and the MOS transistors are disposed in the high-impedance semiconductor layer. Minority carriers will then remain in the weakly doped layer, because they are exposed to less resistance there than in the highly doped substrate. As mentioned above, such a circuit is disclosed on page 167 of the aforementioned publication by R. Troutman.

Figure 2:
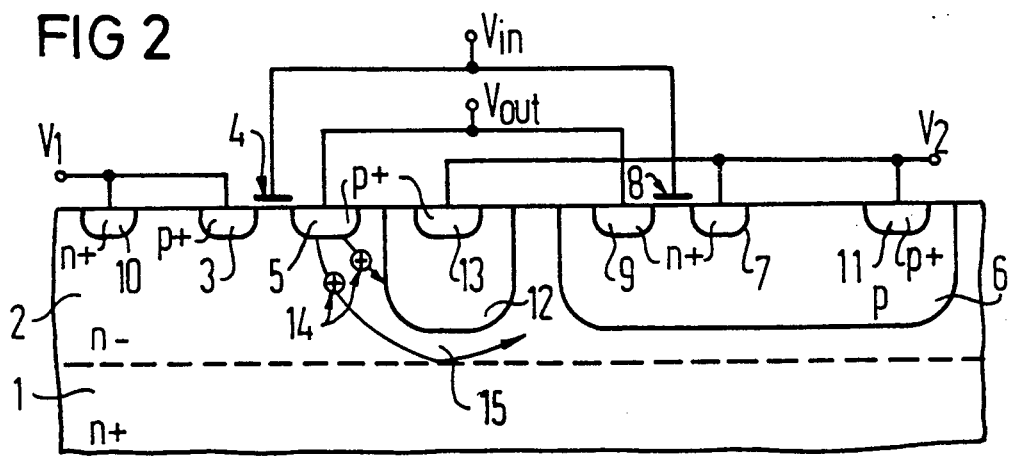
FIG. 2 is a view similar to FIG. 1 showing a CMOS circuit with conventional provisions for reducing latch-up sensitivity.

FIG. 2 shows a circuit of that kind using the example of a p-well technique. A weakly doped n-epitaxial layer 2 has been applied to a highly doped n+semiconductor substrate 1. A first MOS transistor, including a first source structure 3, a first gate 4 and a first drain structure 5, is disposed in the epitaxial layer. A second complementary MOS transistor, including a second source structure 7, a second gate 8 and a second drain structure 9, is located in a p-doped well 6 in the epitaxial layer 2. The source and drain structures 3, 5, 7, 9 are provided by means of diffused-in highly doped zones. The gates 4, 8 of the two transistors are connected at an input $V_{IN}$, and the drain structures 5, 9 are connected at an output $V_{OUT}$. The first source structure 3 is connected to a first supply potential $V_1$, and the second source structure 7 is connected to a second supply potential $V_2$. In this case, $V_1 > V_2$. The semiconductor substrate 1 is connected through a substrate terminal 10 in the epitaxial layer 2 to the first supply potential $V_1$, and the well 6 is connected through a well terminal 11 to the second supply potential $V_2$. An additionally diffused-in p-doped zone, a guard ring 12, is also connected to the second supply potential $V_2$ through a guard ring terminal 13. Through the use of the guard ring 12, minority carriers 14 that are injected into the epitaxial layer 2 in the event of disruptions at the output $V_{OUT}$ (that is, if $V_{OUT} > V_1$) are siphoned off and do not reach the p-well 6.

In the case of highly injected currents, the effectiveness of such a guard ring is lessened by the fact that the minority carriers 14 reach the well 6 through a tunnel 15 between the lower edge of the guard ring 12 and the boundary surface between the semiconductor layer 2 and the semiconductor substrate 1. In order to reduce the likelihood of such an occurrence, the tunnel 15 must have a small cross section and/or be very long. In the first case the depth of the diffused zone acting as a guard ring 12 must be great and must be readily adjustable. In the second case, the lateral extent of the diffused zone 12 must be great. In other words, the guard ring 12 occupies a great deal of space on the surface of the semiconductor. Accordingly, both versions have disadvantages in practice.

Figure 3:
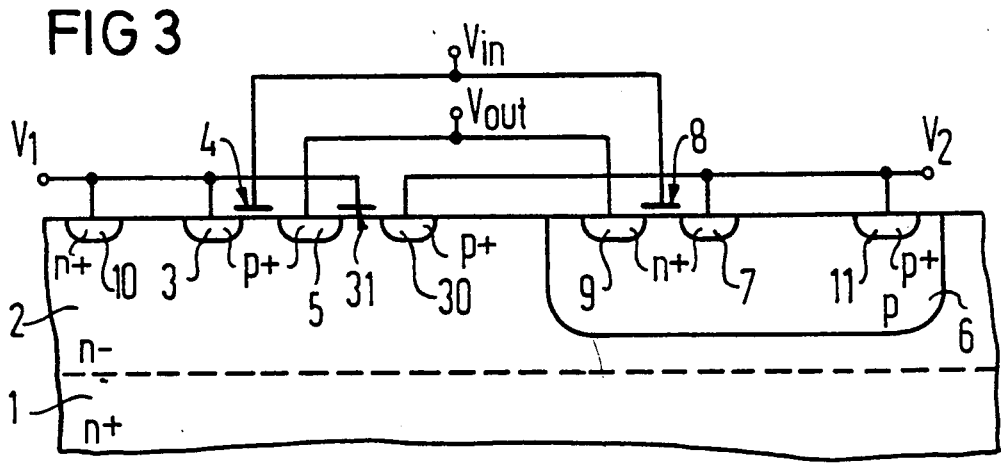
FIG. 3 is a view similar to FIGS. 1 and 2 showing an embodiment of the circuit according to the invention.

The same basic circuit as is shown in FIG. 2 has been selected for the embodiment of the invention shown in FIG. 3, so that only the parts which are essential to the invention will be described below. A further doped zone 30 of the same conduction type as the first transistor is provided as a third drain structure of a third transistor, which is disposed between the first drain structure 5 and the well 6 and is connected to the second supply potential $V_2$. In this embodiment, the first drain structure 5 is simultaneously a third source structure of the third transistor. A third gate 31 of the third transistor, which is connected to the first supply potential $V_1$, is also provided between the first drain structure 5 and the third drain structure 30. Preferably, the second supply potential $V_2$ is ground potential (also referred to as $V_{SS}$), and the first supply potential $V_1$ is positive (referred to as $V_{DD}$).

Depending on the potential at the output $V_{OUT}$, the third transistor fulfills the object of siphoning the minority carriers 14 out of the weakly doped semiconductor layer 2 in two different ways. These will be illustrated below wherein $V_T$ indicates the threshold voltage, as described in the publication by K. Horninger, entitled Integrierte MOS-Schaltungen [Integrated MOS Circuits], Springer 1987, page 54:

Case 1: $V_{DD} + V_T > V_{OUT} > V_{DD}$.

The third transistor acts as a bipolar transistor, and the emitter is formed by the third source structure (which in this embodiment is identical to the first drain structure 5), the base is formed by the substrate 1 or the semiconductor layer 2, and the collector is formed by the third drain structure 30. The potentials applied are thus $V_{OUT}$ at the emitter, $V_{DD}(<V_{OUT})$ at the base, and $V_{SS}(=0)$ at the collector. The bipolar transistor attains approximately 10 times greater current amplification than the parasitic lateral bipolar transistor 23.

Case 2: $V_{OUT} > V_{DD} + V_T$

The third transistor acts as a p-channel MOS transistor wired as a gate circuit. The potential difference between the source and gate is at least VT and is polarized in such a way that the MOS transistor becomes conducting. In this way, the occurrence of the latch-up effect can be prevented even in the event of major disturbances at the output $V_{OUT}$.

Further embodiments:

1. The use of a weakly doped semiconductor layer 2 on a highly doped semiconductor substrate 1 shown in FIG. 3 is advantageous. However, the circuit according to the invention can also be used if the complementary MOS transistors are disposed directly in a semiconductor substrate 1.

2. The third source structure can be disposed separately from the first drain structure 5 in the semiconductor substrate 1 or the semiconductor layer 2 and can be connected to the output $V_{OUT}$.

I claim:

1. Circuit for reducing the latch-up sensitivity in complementary MOS technology, comprising:
   a semiconductor substrate of a second conductivity type;
   a first MOS transistor of a first complementary conductivity type being disposed in said semiconductor substrate and having a source structure, a gate and a drain;

a well of the first conductivity type being disposed in said semiconductor substrate;

a second MOS transistor of the second conductivity type being disposed in said well and having a source structure, a gate and a drain;

said semiconductor substrate and said source structure of said first transistor being connected to a first supply potential;

said well and said source structure of said second transistor being connected to a second supply potential;

said gates of said first and second transistors being connected to an input, an said drains of said first and second transistors being connected to an output;

a third transistor of the first conductivity type being disposed in said semiconductor substrate between said first and second transistors; and said third transistor having a gate connected to the first supply potential, a drain structure connected to the second supply potential, and a source structure connected to an output.

2. Circuit according to claim 1, wherein said first transistor has a drain structure disposed closely adjacent said source structure of said third transistor.

3. Circuit according to claim 1, wherein said drain of said first transistor is a drain structure being overlapped by said source structure of said third transistor.

4. Circuit according to claim 1, wherein the first conductivity type is p-conductivity and the second conductivity type is n-conductivity; said semiconductor substrate is n-doped; said well is p-doped; and the first supply potential is greater than the second supply potential.

5. Circuit according to claim 1, wherein the first conductivity type is n-conductivity and the second conductivity type is p-conductivity; said semiconductor substrate is p-doped; said well is n-doped; and the first supply potential is less than the second supply potential.

6. Circuit according to claim 1, wherein said semiconductor substrate includes a relatively highly doped lower region and a relatively weakly doped upper region in the form of a semiconductor layer disposed on said lower region; said well and said transistors being disposed in said semiconductor layer.

7. Circuit according to claim 4, wherein said semiconductor substrate includes a relatively highly doped lower region and a relatively weakly doped upper region in the form of a semiconductor layer disposed on said lower region; said well and said transistors being disposed in said semiconductor layer.

8. Circuit according to claim 5, wherein said semiconductor substrate includes a relatively highly doped lower region and a relatively weakly doped upper region in the form of a semiconductor layer disposed on said lower region; said well and said transistors being disposed in said semiconductor layer.

* * * * *